(12) United States Patent
Qiu et al.

(10) Patent No.: US 9,706,669 B2
(45) Date of Patent: Jul. 11, 2017

(54) RIGID-FLEXIBLE CIRCUIT BOARD HAVING FLYING-TAIL STRUCTURE AND METHOD FOR MANUFACTURING SAME

(71) Applicants: GUANGZHOU FASTPRINT CIRCUIT TECH CO., LTD., Guangzhou (CN); SHENZHEN FASTPRINT CIRCUIT TECH CO., LTD., Shenzhen (CN); YIXING SILICON VALLEY ELECTRONICS TECHNOLOGY CO., LTD., Yixing (CN)

(72) Inventors: Xingya Qiu, Guangzhou (CN); Chutao Lin, Guangzhou (CN); Bei Chen, Guangzhou (CN)

(73) Assignees: GUANGZHOU FASTPRINT CIRCUIT TECH CO., LTD., Guangzhou (CN); SHENZHEN FASTPRINT CIRCUIT TECH CO., LTD., Shenzhen (CN); YIXING SILICON VALLEY ELECTRONICS TECHNOLOGY CO., LTD., Yixing (CN)

( * ) Notice: Subject to any disclaimer, the term of this patent is extended or adjusted under 35 U.S.C. 154(b) by 0 days.

(21) Appl. No.: 15/102,803

(22) PCT Filed: Dec. 11, 2014

(86) PCT No.: PCT/CN2014/093545
§ 371 (c)(1),
(2) Date: Jul. 18, 2016

(87) PCT Pub. No.: WO2015/085934
PCT Pub. Date: Jun. 18, 2015

(65) Prior Publication Data
US 2016/0324012 A1 Nov. 3, 2016

(30) Foreign Application Priority Data

Dec. 11, 2013 (CN) .......................... 2013 1 0676254

(51) Int. Cl.
*H05K 1/00* (2006.01)
*H05K 3/46* (2006.01)
(Continued)

(52) U.S. Cl.
CPC .......... *H05K 3/4691* (2013.01); *H05K 1/028* (2013.01); *H05K 1/0298* (2013.01); *H05K 1/09* (2013.01);
(Continued)

(58) Field of Classification Search
CPC .. H05K 1/00; H05K 1/02; H05K 1/09; H05K 1/11; H05K 1/14; H05K 1/28;
(Continued)

(56) References Cited

U.S. PATENT DOCUMENTS 5,499,444 A * 3/1996 Doane, Jr. ............ H05K 3/4691
156/252
8,400,782 B2 * 3/2013 Aoyama ................ H05K 1/142
174/255
(Continued)

FOREIGN PATENT DOCUMENTS

CN 102045949 A 5/2011
CN 201957328 U 8/2011
(Continued)

OTHER PUBLICATIONS

English Translation of PCT Search Report for International Application No. PCT/CN2014/093545; mailed on Feb. 11, 2015.
(Continued)

*Primary Examiner* — Xiaoliang Chen
(74) *Attorney, Agent, or Firm* — Kagan Binder, PLLC

(57) ABSTRACT

Provided is a method for manufacturing a rigid-flexible circuit board having a flying-tail structure, comprising the
(Continued)

following steps: step 1: manufacturing core substrates needed by daughter boards (500), the cord boards needed by each daughter board comprising at least one flexible core substrate (510) and at least one rigid core substrate (520), stacking and laminating the core substrates to manufacture daughter boards, the number of the manufactured daughter boards being equal to the number of second rigid areas (300), and each daughter board comprising a partial first rigid area (110), a flexible area (200), and a second rigid area (300); step 2, stacking the daughter boards obtained in step 1, and pasting polyetherimide covering films (400) on solder-resist areas of adjacent end surfaces of the second rigid areas; and step 3, providing PTFE gaskets (600) between adjacent flexible areas and adjacent second rigid areas, laminating the daughter boards that have been processed in step 2, and laminating the partial first rigid areas of the daughter plates together to form a first rigid area (100). Also provided is a rigid-flexible circuit board having a flying-tail structure. The method for manufacturing a rigid-flexible circuit board having a flying-tail structure can effectively prevent the solder-resist layer from being damaged.

8 Claims, 4 Drawing Sheets

(51) Int. Cl.
*H05K 1/02* (2006.01)
*H05K 1/09* (2006.01)
*H05K 1/11* (2006.01)
*H05K 3/00* (2006.01)
*H05K 3/42* (2006.01)

(52) U.S. Cl.
CPC ............ *H05K 1/115* (2013.01); *H05K 3/0047* (2013.01); *H05K 3/423* (2013.01); *H05K 3/429* (2013.01); *H05K 3/4611* (2013.01); *H05K 2203/061* (2013.01); *H05K 2203/068* (2013.01); *H05K 2203/308* (2013.01)

(58) Field of Classification Search
CPC . H05K 1/115; H05K 3/00; H05K 3/10; H05K 3/35; H05K 3/46; H05K 3/47; H05K 3/423; H05K 3/429; H05K 3/4611; H05K 3/4691; H05K 3/4697
USPC ........ 174/254, 255, 260, 261; 156/222, 252, 156/306.3; 29/829, 846; 361/749, 795
See application file for complete search history.

(56) References Cited

U.S. PATENT DOCUMENTS

| | | | |
|---|---|---|---|
| 2010/0051325 A1* | 3/2010 | Sato | H05K 3/4691 174/254 |
| 2011/0067904 A1* | 3/2011 | Aoyama | H05K 3/4069 174/254 |
| 2011/0194262 A1* | 8/2011 | Naganuma | H05K 3/4691 361/749 |
| 2011/0198111 A1* | 8/2011 | Naganuma | H05K 3/4691 174/254 |
| 2011/0199739 A1* | 8/2011 | Naganuma | H05K 3/4691 361/749 |
| 2011/0300307 A1* | 12/2011 | Nakai | H05K 3/0035 427/555 |
| 2012/0181074 A1* | 7/2012 | Ishihara | H05K 3/4691 174/261 |
| 2012/0325524 A1 | 12/2012 | Naganuma et al. | |

FOREIGN PATENT DOCUMENTS

| | | |
|---|---|---|
| CN | 201976338 U | 9/2011 |
| CN | 202059671 U | 11/2011 |
| CN | 102843860 A | 12/2012 |
| CN | 103687284 A | 3/2014 |
| KR | 100674303 B1 | 1/2007 |
| KR | 20100028214 A | 3/2010 |

OTHER PUBLICATIONS

English Translation of PCT Written Opinion for International Application No. PCT/CN2014/093545; mailed on Feb. 11, 2015.
Search Report & First Office Action for Priority Chinese Patent Application No. 201310676254.0, mailed on Mar. 15, 2016.
Second Office Action for Priority Chinese Patent Application No. 201310676254.0, mailed on Aug. 2, 2016.

* cited by examiner

RIGID-FLEXIBLE CIRCUIT BOARD HAVING FLYING-TAIL STRUCTURE AND METHOD FOR MANUFACTURING SAME

FIELD

The present disclosure relates generally to the technical field of print circuit board, and more particularly, to a rigid-flex circuit board having a flying-tail structure and a method for manufacturing the same.

BACKGROUND

The rigid-flex circuit board is developed on the basis of the rigid circuit board and the flexible circuit board, which inherits the characteristics of the rigid circuit board and the flexible circuit board, and has advantages such as compact dimensions, low weight, flexible structure and 3D cubic packaging, so it attracts more and more attention. The rigid-flex circuit board fits the development trend of miniaturization and portability of electronics at present, and its market demand is growing.

The flexibility of the rigid-flex circuit board also determines the diversity of the structures of the rigid-flex circuit board, which brings certain difficulty for production, especially, a rigid-flex circuit board having a flying-tail structure. The flying-tail structure refers to a structure in which the first rigid region is coupled to two or more second rigid regions through the flexible region, and the second rigid regions being like tails flying out of the first rigid region. Traditionally, the rigid-flex circuit board is generally made by one time pressing after stacking core plates. However, if the traditional method for manufacturing the rigid-flex circuit board is adopted, the solder-resist layer on the second rigid region is easy to be damaged for the rigid-flex circuit board having the flying-tail structure.

SUMMARY

Based on the above, it is an objective of the present disclosure to provide a rigid-flex circuit board having a flying-tail structure, to prevent the solder-resist layer from being damaged and improve the qualified rate of the rigid-flex circuit board having the flying-tail structure, in order to overcome the defects in the prior art.

According to an aspect of the present disclosure, a rigid-flex circuit board having a flying-tail structure is provided, including a first rigid region, at least two flexible regions, and a plurality of second rigid regions with a number equal to the number of flexible regions, wherein the one end of the first rigid region is coupled to one end of each of the flexible regions respectively, the other end of each of the flexible regions is coupled to one of the plurality of second rigid regions respectively, and polyetherimide covering films are attached to solder-resist areas of adjacent end surfaces of the respective second rigid regions.

According to another aspect of the present disclosure, a method for manufacturing a rigid-flex circuit board having a flying-tail structure is provided, which prevents the solder-resist layer from being damaged and improves the qualified rate of the rigid-flex circuit board having the flying-tail structure.

The method for manufacturing the rigid-flex circuit board having the flying-tail structure includes the following steps:

step 1, making core plates required by respective sub-boards, the core plates required by the respective sub-boards including at least one flexible core plate and at least one rigid core plate, and stacking and laminating the core plates to make the sub-boards, the number of the sub-boards being equal to the number of second rigid regions, with each of the sub-boards including a partial first rigid region, one flexible region and one second rigid region;

step 2, stacking all the sub-boards made in the step 1, and attaching polyetherimide covering films to solder-resist areas of adjacent end surfaces of the respective second rigid regions; and step 3, providing a PTFE spacer between adjacent flexible regions and between adjacent second rigid regions, laminating all the sub-boards that have been processed in the step 2, the partial first rigid regions of the sub-boards being laminated together to form a first rigid region.

Preferably, the polyetherimide covering film in the step 2 is attached to solder-resist areas of adjacent end surfaces of the respective second rigid regions by an electric iron, and is pressed by a pressing machine.

Preferably, each of the core plates required by the respective sub-boards in the step 1 is made by the following steps:

making non-outermost circuits of the core plates required by the respective sub-boards according to a stacking requirement of the core plates required by the respective sub-boards;

attaching a covering film to a flexible region of the respective flexible core plate; and opening a window on a non-outermost rigid core plate corresponding to the flexible region by milling, according to a stacking requirement of the sub-boards required by the rigid-flex circuit board having the flying-tail structure.

Preferably, before attaching polyetherimide covering films to solder-resist areas of adjacent end surfaces of the respective second rigid regions in the step 2, it further includes the following steps:

performing drilling, copper depositing and electroplating on the second rigid region of each of the sub-boards;

performing vacuum resin clogging and ceramic grinding on each through hole; and making non-outermost circuits of the rigid-flex circuit board having the flying-tail structure.

Preferably, after attaching polyetherimide covering films to solder-resist areas of adjacent end surfaces of the respective second rigid regions in the step 2, it further includes the following steps:

performing surface processing on a surface soldering pad of each of the sub-boards; and attaching a polyetherimide adhesive tape to the surface soldering pad of each of the sub-boards, performing brown oxidization on each of the sub-boards, and removing the polyetherimide adhesive tape.

Preferably, after laminating the partial first rigid regions of the sub-boards together to form a first rigid region of the rigid-flex circuit board as described in step 3, it further includes the following steps:

performing drilling, copper depositing and electroplating on the first rigid region;

making an outermost circuit of the rigid-flex circuit board having the flying-tail structure, and performing solder resist and surface processing on outermost end surfaces; and performing controlled deep milling on an outermost rigid core plate corresponding to the flexible region, to expose the corresponded flexible region, according to a stacking requirement of the sub-boards required by the rigid-flex circuit board having the flying-tail structure.

Preferably, before laminating the core plates of each of the sub-boards in the step 1, the core plates are bound and riveted together through a non-flowable prepreg with a resin flow of 30 mils~120 mils.

Preferably, before laminating all the sub-boards in the step 3, the partial first rigid regions of the respective sub-boards are bound and riveted together through a non-flowable prepreg with a resin flow of 30 mils~120 mils.

In the rigid-flex circuit board having the flying-tail structure, polyetherimide covering films are attached to solder-resist areas of adjacent end surfaces of the respective second rigid regions as the solder-resist layer, which further improves the pressure-resistant strength of the solder-resist layer, to prevent the solder-resist layer of each of the second rigid regions from being damaged and improve the qualified rate of the rigid-flex circuit board having the flying-tail structure.

According to the above method for manufacturing the rigid-flex circuit board having the flying-tail structure, the pressure-resistant strength of the solder-resist layer can be further improved, by making the sub-boards equal to the number of the second rigid regions first and attaching polyetherimide covering films to solder-resist areas of adjacent end surfaces of the respective second rigid regions as the solder-resist layer. In addition, all of the flexible regions and the second rigid regions can be supported by providing a PTFE spacer between adjacent flexible regions and between adjacent second rigid regions and laminating all the sub-boards, to effectively prevent the flexible regions from wrinkling, and the soldering pad and solder-resist layer on the second rigid region from being damaged, to improve the qualified rate of the rigid-flex circuit board having the flying-tail structure.

DESCRIPTION OF APPENDED DRAWING REFERENCE SIGNS

100 first rigid region, 110 partial first rigid region, 200 flexible region, 300 second rigid region, 310 through hole, 400 polyetherimide covering film, 500 sub-board, 510 flexible core plate, 520 rigid core plate, 600 PTFE spacer, 700 covering film, and 800 circuit.

DETAILED DESCRIPTION OF THE PREFERRED EMBODIMENTS

The present disclosure may be best understood by reference to the following description taken in conjunction with the accompanying drawings.

Figure 1:
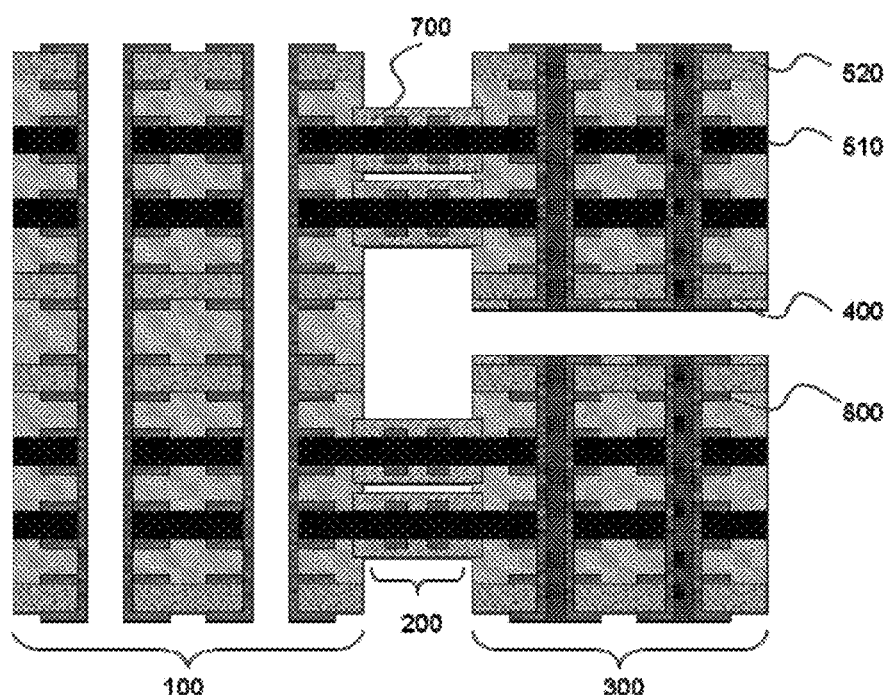
FIG. 1 is a schematic diagram showing a cross section of a rigid-flex circuit board having a flying-tail structure according to one embodiment of the present disclosure.

As shown in FIG. 1, a rigid-flex circuit board having a flying-tail structure is provided, including a first rigid region 100, at least two flexible regions 200, and a plurality of second rigid regions 300 with a number equal to the number of flexible regions 200, wherein the one end of the first rigid region 100 is coupled to one end of each of the flexible regions 200 respectively, the other end of each of the flexible regions 200 is coupled to one of the plurality of second rigid regions 300 respectively, and polyetherimide covering films 400 are attached to solder-resist areas of adjacent end surfaces of the respective second rigid regions 300.

In this embodiment, the rigid-flex circuit board having the flying-tail structure is a rigid-flex circuit board having 16 layers of circuits 800, including two second rigid regions 300 and two flexible regions 200. Compared with the traditional solder-resist layer formed by ejecting ink, it is more convenient in this embodiment to paste polyetherimide covering films 400 on solder-resist areas of adjacent end surfaces of the respective second rigid regions 300 as the solder-resist layer, and the polyetherimide covering films 400 has good performance so that it is difficult to be damaged at high temperatures under high pressure, which further improves the pressure-resistant strength of the solder-resist layer, to prevent the solder-resist layer of each of the second rigid regions 300 from being damaged and improve the qualified rate of the rigid-flex circuit board having the flying-tail structure.

As shown in FIGS. 1, 2, 3 and 4, a method for manufacturing a rigid-flex circuit board having a flying-tail structure is provided, including the following steps:

step 1, making core plates required by respective sub-boards 500, the core plates required by the respective sub-boards 500 including at least one flexible core plate 510 and at least one rigid core plate 520, and stacking and laminating the core plates to make the sub-boards, the number of the sub-boards being equal to the number of second rigid regions 300, with each of the sub-boards including a partial first rigid region 110, one flexible region 200 and one second rigid region 300;

step 2, stacking all the sub-boards 500 made in the step 1, and attaching polyetherimide covering films 400 to solder-resist areas of adjacent end surfaces of the respective second rigid regions; and step 3, providing a PTFE spacer 600 between adjacent flexible regions 200 and between adjacent second rigid regions 300, laminating all the sub-boards that have been processed in the step 2, the partial first rigid regions of the sub-boards being laminated together to form a first rigid region 100.

The method for manufacturing the rigid-flex circuit board having the flying-tail structure in this embodiment can make the sub-boards 500 equal to the number of second rigid regions 300 first, to avoid out of alignment, layering, or other problem caused by one time laminating of multilayer core plates, to reduce the rejection rate of the rigid-flex circuit board having the flying-tail structure during the laminating. Attaching polyetherimide covering films 400 to solder-resist areas of adjacent end surfaces of the respective second rigid regions 300 as the solder-resist layer can further improve the pressure-resistant strength of the solder-resist layer. In addition, all of the flexible regions 200 and the second rigid regions 300 can be supported by providing a PTFE spacer 600 between adjacent flexible regions 200 and between adjacent second rigid regions 300 and laminating all the sub-boards 500, to effectively prevent the flexible regions 200 from wrinkling, and the soldering pad and solder-resist layer on the second rigid region 300 from being damaged, to improve the qualified rate of the rigid-flex circuit board having the flying-tail structure.

In this embodiment, the polyetherimide covering film 400 in the step 2 is attached to solder-resist areas of adjacent end surfaces of the respective second rigid regions by an electric iron, and is pressed by a pressing machine, so the polyetherimide covering film 400 can be firmly attached to the solder-resist area of the second rigid region 300, and the polyetherimide covering film 400 as the solder-resist layer can withstand the subsequent laminating operation at high temperatures under high pressure.

Figure 2:
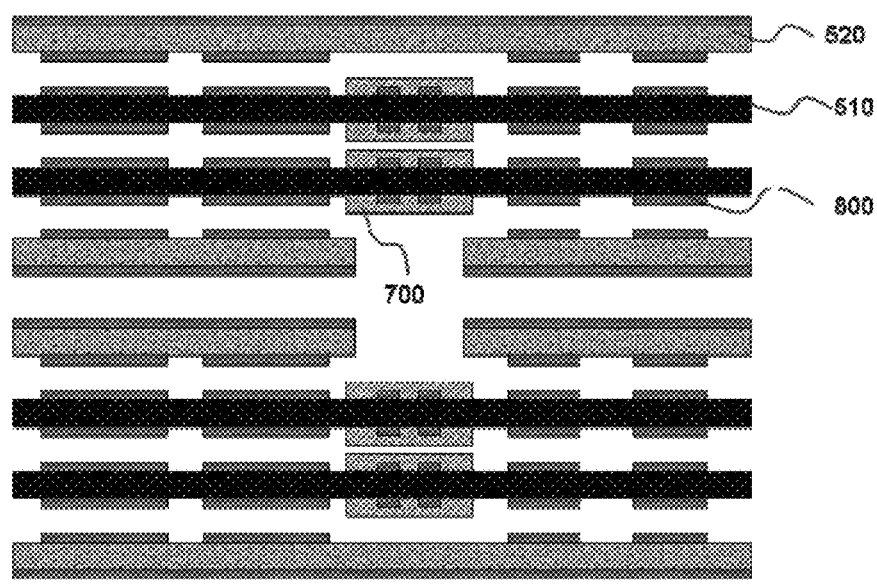
FIG. 2 is a schematic diagram showing a cross section of core plates required by respective sub-boards before being laminated according to one embodiment of the present disclosure.

As shown in FIG. 2 in this embodiment, each of the core plates required by the respective sub-boards in the step 1 is made by the following steps:

making non-outermost circuits of the core plates required by the respective sub-boards according to a stacking requirement of the core plates required by the respective sub-boards 500;

attaching a covering film 700 to a flexible region of the respective flexible core plate 510; and opening a window on a non-outermost rigid core plate 520 corresponding to the flexible region 200 by milling, according to a stacking requirement of the sub-boards required by the rigid-flex circuit board having the flying-tail structure. Attaching the covering film 700 to the flexible region of the respective flexible core plate 510 can prevent the circuit in the flexible region from being oxidized. During the making process of the core plates required by the respective sub-boards, opening the window on the non-outermost rigid core plate 520 corresponding to the flexible region by milling can avoid the problem that it is difficult to open the window in subsequent operations. The dimensions of the window are equal to or slightly more than those of the flexible region 200.

Figure 3:
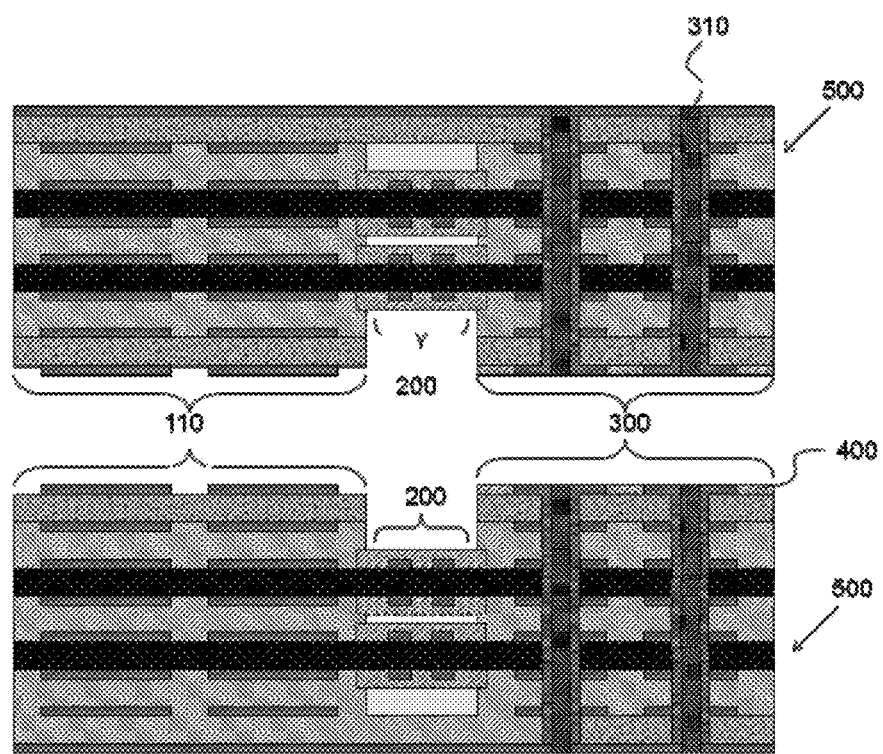
FIG. 3 is a schematic diagram showing a cross section of sub-boards before being laminated according to one embodiment of the present disclosure.

As shown in FIG. 3, before attaching polyetherimide covering films 400 to solder-resist areas of adjacent end surfaces of the respective second rigid regions in the step 2, it further includes the following steps:

performing drilling, copper depositing and electroplating on the second rigid region 300 of each of the sub-boards;

performing vacuum resin clogging and ceramic grinding on each through hole 310; and making non-outermost circuits of the rigid-flex circuit board having the flying-tail structure.

Performing drilling, copper depositing and electroplating on the second rigid region 300 before laminating the sub-boards can avoid difficulty in drilling after the sub-boards being laminated. In addition, drilling the second rigid region 300 of each of the sub-boards separately can achieve the asymmetric configuration of the through holes of the second rigid regions 300, based on the actual demand. In FIG. 3, the through holes of the second rigid regions 300 are symmetrically configured.

As shown in FIG. 3, before laminating the core plates of each of the sub-boards in the step 1, the core plates are bound and riveted together through a non-flowable prepreg with a resin flow of 30 mils~120 mils.

After attaching polyetherimide covering films to solder-resist areas of adjacent end surfaces of the respective second rigid regions in the step 2, it further includes the following steps:

performing surface processing on a surface soldering pad of each of the sub-boards; and attaching a polyetherimide adhesive tape to the surface soldering pad of each of the sub-boards, performing brown oxidization on each of the sub-boards, and removing the polyetherimide adhesive tape.

Attaching the polyetherimide adhesive tape to the surface soldering pad of each of the sub-boards before performing brown oxidization on each of the sub-boards can prevent the soldering pad from being oxidized.

Figure 4:
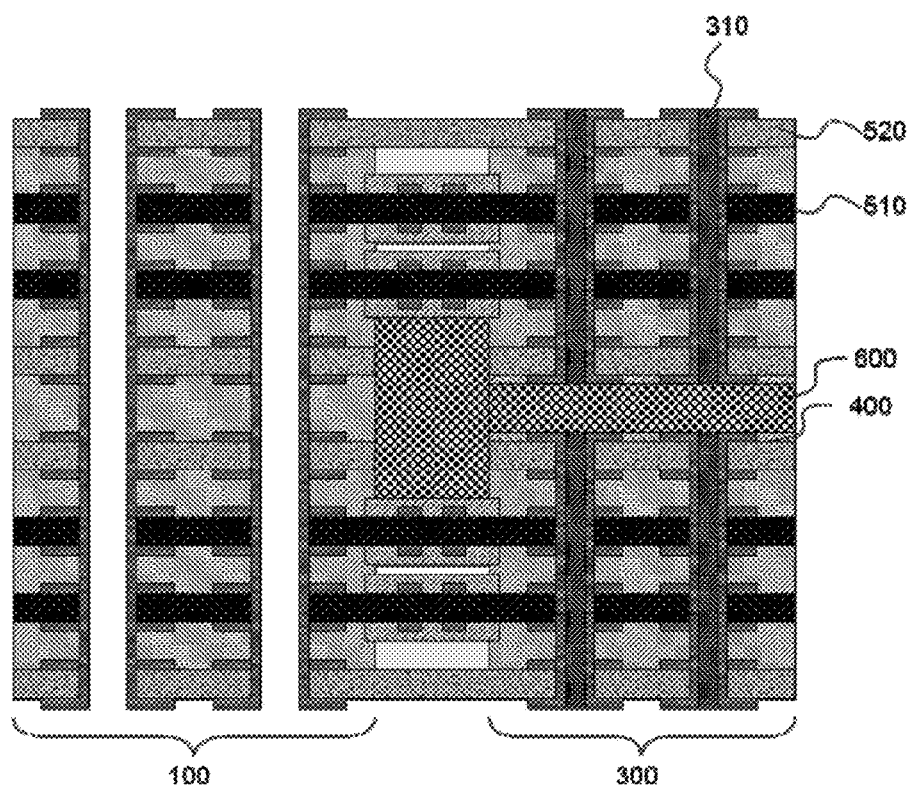
FIG. 4 is a schematic diagram showing a cross section of sub-boards being laminated according to one embodiment of the present disclosure.

As shown in FIG. 4, before laminating all the sub-boards in the step 3, the partial first rigid regions 110 of the respective sub-boards are bound and riveted together through a non-flowable prepreg with a resin flow of 30 mils~120 mils.

As shown in FIGS. 1 and 4, after laminating the partial first rigid regions of the sub-boards together to form a first rigid region 100 of the rigid-flex circuit board as described in step 3, it further includes the following steps:

performing drilling, copper depositing and electroplating on the first rigid region 100;

making an outermost circuit of the rigid-flex circuit board having the flying-tail structure, and performing solder resist and surface processing on end surfaces; and performing controlled deep milling on an outermost rigid core plate corresponding to the flexible region, to expose the corresponded flexible region 200, according to a stacking requirement of the sub-boards required by the rigid-flex circuit board having the flying-tail structure.

Since the flexible region 200 is bendable, and the first rigid region 100 is coupled to the second rigid region 300 through the flexible 200, so the position relation between the first rigid region 100 and the second rigid region 300 can be flexibly adjusted to facilitate the installation of the rigid-flex circuit board having the flying-tail structure.

The above are embodiments of the disclosure described in detail, and should not be deemed as limitations to the scope of the present disclosure. It should be noted that variations and improvements will become apparent to those skilled in the art to which the present disclosure pertains without departing from its spirit and scope. Therefore, the scope of the present disclosure is defined by the appended claims.

What is claimed is:

1. A method for manufacturing a rigid-flex circuit board having a flying-tail structure, comprising the following steps:

step 1, making core plates required by respective sub-boards, the core plates required by the respective sub-boards including at least one flexible core plate and at least one rigid core plate, and stacking and laminating the core plates to make the sub-boards, the number of the sub-boards being equal to the number of second rigid regions, with each of the sub-boards including a partial first rigid region, one flexible region and one second rigid region;

step 2, stacking all the sub-boards made in the step 1, and attaching polyetherimide covering films to solder-resist areas of adjacent end surfaces of the respective second rigid regions; and step 3, providing a PTFE spacer between adjacent flexible regions and between adjacent second rigid regions, laminating all the sub-boards that have been processed in the step 2, the partial first rigid regions of the sub-boards being laminated together to form a first rigid region.

2. The method for manufacturing the rigid-flex circuit board having the flying-tail structure according to claim 1, wherein the polyetherimide covering film in the step 2 is attached to solder-resist areas of adjacent end surfaces of the respective second rigid regions by an electric iron, and is pressed by a pressing machine.

3. The method for manufacturing the rigid-flex circuit board having the flying-tail structure according to claim 2, wherein each of the core plates required by the respective sub-boards in the step 1 is made by the following steps:

making non-outermost circuits of the core plates required by the respective sub-boards according to a stacking requirement of the core plates required by the respective sub-boards;

attaching a covering film to a flexible region of the respective flexible core plate; and opening a window on a non-outermost rigid core plate corresponding to the flexible region by milling, according to a stacking requirement of the sub-boards required by the rigid-flex circuit board having the flying-tail structure.

4. The method for manufacturing the rigid-flex circuit board having the flying-tail structure according to claim 3, further comprising, before attaching polyetherimide covering films to solder-resist areas of adjacent end surfaces of the respective second rigid regions in the step 2, the following steps:

performing drilling, copper depositing and electroplating on the second rigid region of each of the sub-boards;

performing vacuum resin clogging and ceramic grinding on each through hole; and making non-outermost circuits of the rigid-flex circuit board having the flying-tail structure.

5. The method for manufacturing the rigid-flex circuit board having the flying-tail structure according to claim 4, further comprising, after attaching polyetherimide covering films to solder-resist areas of adjacent end surfaces of the respective second rigid regions in the step 2, the following steps:

performing surface processing on a surface soldering pad of each of the sub-boards; and attaching a polyetherimide adhesive tape to the surface soldering pad of each of the sub-boards, performing brown oxidization on each of the sub-boards, and removing the polyetherimide adhesive tape.

6. The method for manufacturing the rigid-flex circuit board having the flying-tail structure according to claim 5, further comprising, after laminating the partial first rigid regions of the sub-boards together to form a first rigid region of the rigid-flex circuit board as described in step 3, the following steps:

performing drilling, copper depositing and electroplating on the first rigid region;

making an outermost circuit of the rigid-flex circuit board having the flying-tail structure, and performing solder resist and surface processing on outermost end surfaces; and performing controlled deep milling on an outermost rigid core plate corresponding to the flexible region, to expose the corresponded flexible region, according to a stacking requirement of the sub-boards required by the rigid-flex circuit board having the flying-tail structure.

7. The method for manufacturing the rigid-flex circuit board having the flying-tail structure according to claim 1, wherein before laminating the core plates of each of the sub-boards in the step 1, the core plates are bound and riveted together through a non-flowable prepreg with a resin flow of 30 mils~120 mils.

8. The method for manufacturing the rigid-flex circuit board having the flying-tail structure according to claim 7, wherein before laminating all the sub-boards in the step 3, the partial first rigid regions of the respective sub-boards are bound and riveted together through a non-flowable prepreg with a resin flow of 30 mils~120 mils.

* * * * *